(12) United States Patent
Stohler et al.

(10) Patent No.: US 11,522,017 B2
(45) Date of Patent: Dec. 6, 2022

(54) ORGANIC PHOTORECEPTORS

(71) Applicant: Xarpotech UG (Haftungsbeschraenkt), Oelbronn-Duerrn (DE)

(72) Inventors: Frank Stohler, Oelbronn-Duerrn (DE); Manfred Notter, Oelbronn-Duerrn (DE)

(73) Assignee: XARPOTECH UG (HAFTUNGSBESCHRAENKT), Oelbronn-Duerrn (DE)

( * ) Notice: Subject to any disclaimer, the term of this patent is extended or adjusted under 35 U.S.C. 154(b) by 135 days.

(21) Appl. No.: 16/961,709

(22) PCT Filed: Jan. 10, 2019

(86) PCT No.: PCT/EP2019/050529
§ 371 (c)(1),
(2) Date: Jul. 13, 2020

(87) PCT Pub. No.: WO2019/137992
PCT Pub. Date: Jul. 18, 2019

(65) Prior Publication Data
US 2021/0375996 A1 Dec. 2, 2021

(30) Foreign Application Priority Data
Jan. 15, 2018 (DE) .................... 10 2018 100 728.0

(51) Int. Cl.
*H01L 27/30* (2006.01)
*H04N 5/32* (2006.01)
*H04N 5/33* (2006.01)

(52) U.S. Cl.
CPC ............. *H01L 27/307* (2013.01); *H04N 5/32* (2013.01); *H04N 5/33* (2013.01)

(58) Field of Classification Search
CPC ........... H01L 27/307; H04N 5/33; H04N 5/32
See application file for complete search history.

(56) References Cited

U.S. PATENT DOCUMENTS

| | | | | |
|---|---|---|---|---|
| 6,476,376 B1* | 11/2002 | Biegelsen | .......... | H04N 1/00681 250/221 |
| 2002/0017612 A1* | 2/2002 | Yu | ........................ | H01L 51/4206 250/370.11 |
| 2007/0075252 A1* | 4/2007 | Misawa | ................. | A61B 6/032 250/370.11 |
| 2007/0108890 A1* | 5/2007 | Forrest | .............. | H01L 27/14625 313/504 |
| 2007/0263117 A1* | 11/2007 | Kera | ...................... | H04N 5/361 348/E5.037 |

(Continued)

*Primary Examiner* — Shawn S An
(74) *Attorney, Agent, or Firm* — Leydig, Voit & Mayer, Ltd.

(57) ABSTRACT

A sensor unit detects beams. The sensor unit has organic photoreceptors, and at least one computing unit. Respective photoreceptors of the organic photoreceptors are configured to generate a voltage depending on a type and intensity of an incident radiation. The respective photoreceptors of the organic photoreceptors are directly connected to the at least one computing unit as a respective signal source. The at least one computing unit is configured to generate an image from information ascertained from the photoreceptors or from electric pulses.

22 Claims, 10 Drawing Sheets

(56) References Cited

U.S. PATENT DOCUMENTS

| | | | | |
|---|---|---|---|---|
| 2014/0160327 A1* | 6/2014 | Enoki | .................. | H04N 5/2253 257/40 |
| 2016/0204164 A1* | 7/2016 | Zhao | ..................... | G01T 1/2018 250/369 |
| 2018/0011417 A1* | 1/2018 | Shimizu | ............... | G03G 15/065 |
| 2019/0212635 A1* | 7/2019 | Sakai | ..................... | G03B 17/52 |

* cited by examiner

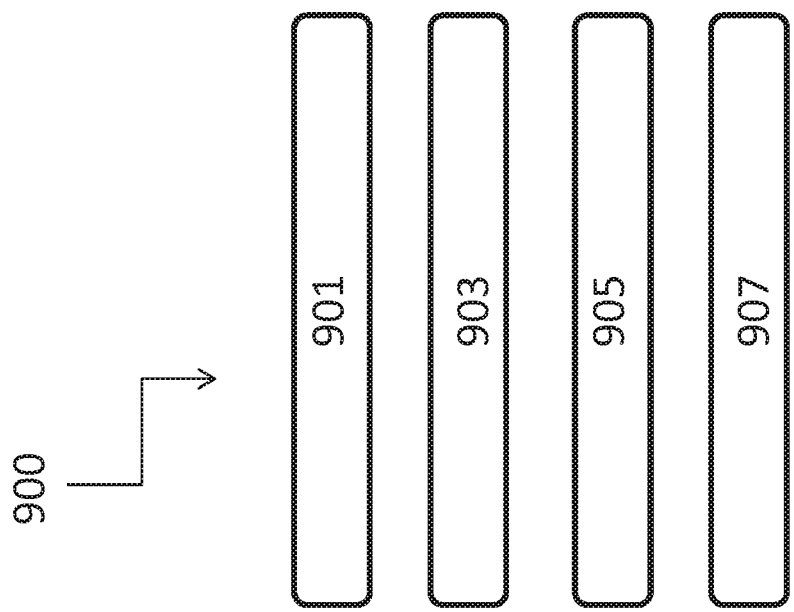
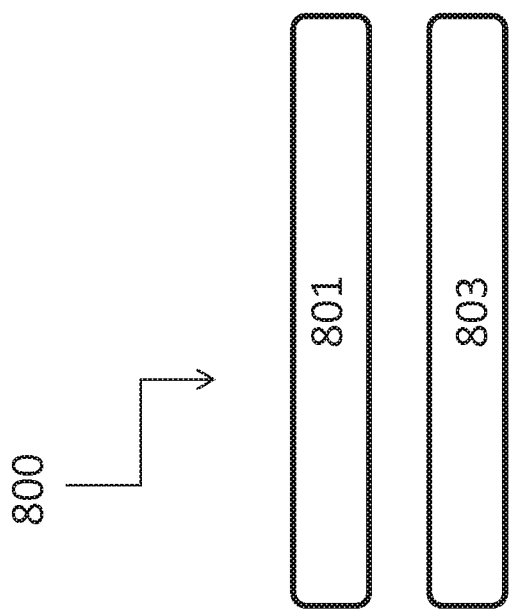

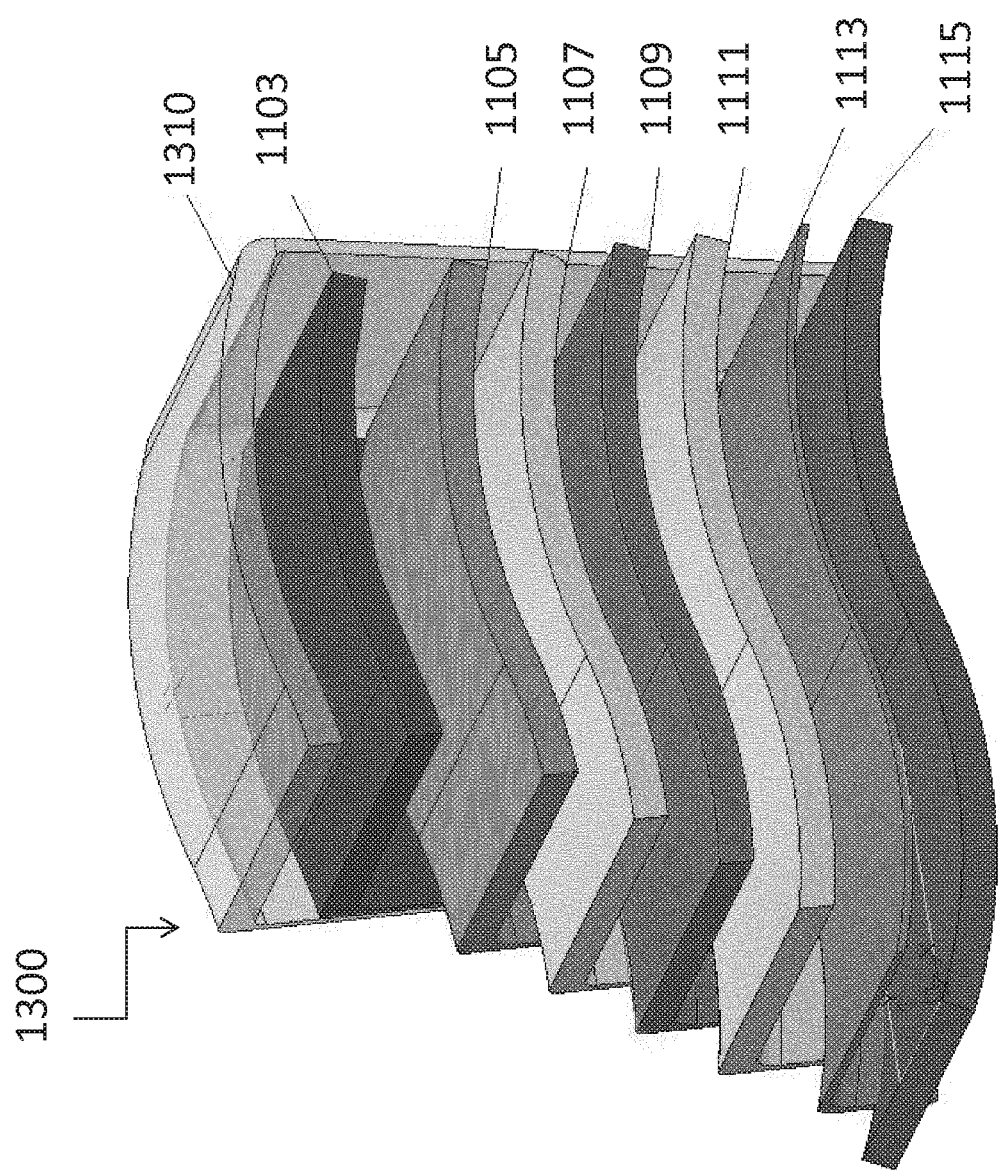

ORGANIC PHOTORECEPTORS

CROSS-REFERENCE TO PRIOR APPLICATIONS

This application is a U.S. National Phase Application under 35 U.S.C. § 371 of International Application No. PCT/EP2019/050529, filed on Jan. 10, 2019, and claims benefit to German Patent Application No. DE 10 2018 100 728.0, filed on Jan. 15, 2018. The International Application was published in German on Jul. 18, 2019 as WO 2019/137992 A1 under PCT Article 21(2).

FIELD

The present invention relates to a sensor unit for detecting beams, a sensor system, a method for manufacturing a sensor unit, a test method for verifying a material structure of a component using the sensor unit, and an image acquisition method for acquiring image information using the sensor unit.

BACKGROUND

To detect beams, such as light, so-called charge-coupled devices, which are also known as CCD sensors, are often used. CCD sensors are generally arranged on a rigid substrate and are geometrically limited depending on their type. Furthermore, CCD sensors are generally limited in their spatial resolution.

Furthermore, organic light-emitting diodes (OLEDs) are known that are excited in the presence of a voltage and can be used to represent image information on a display unit, for example. Display units based on OLEDs can be bent or curved without losing their functionality.

SUMMARY

An embodiment of the present invention provides a sensor unit that detects beams. The sensor unit has organic photoreceptors, and at least one computing unit. Respective photoreceptors of the organic photoreceptors are configured to generate a voltage depending on a type and intensity of an incident radiation. The respective photoreceptors of the organic photoreceptors are directly connected to the at least one computing unit as a respective signal source. The at least one computing unit is configured to generate an image from information ascertained from the photoreceptors or from electric pulses.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 8 shows an exemplary embodiment of the manufacturing method according to the invention;

FIG. 9 shows an exemplary embodiment of the test method according to the invention;

FIG. 13 shows an exemplary embodiment of an organic photoreceptor according to an exemplary embodiment of the sensor unit according to the invention that is essentially completely enclosed by a diffusion-proof enclosure.

DETAILED DESCRIPTION

Figure 1:
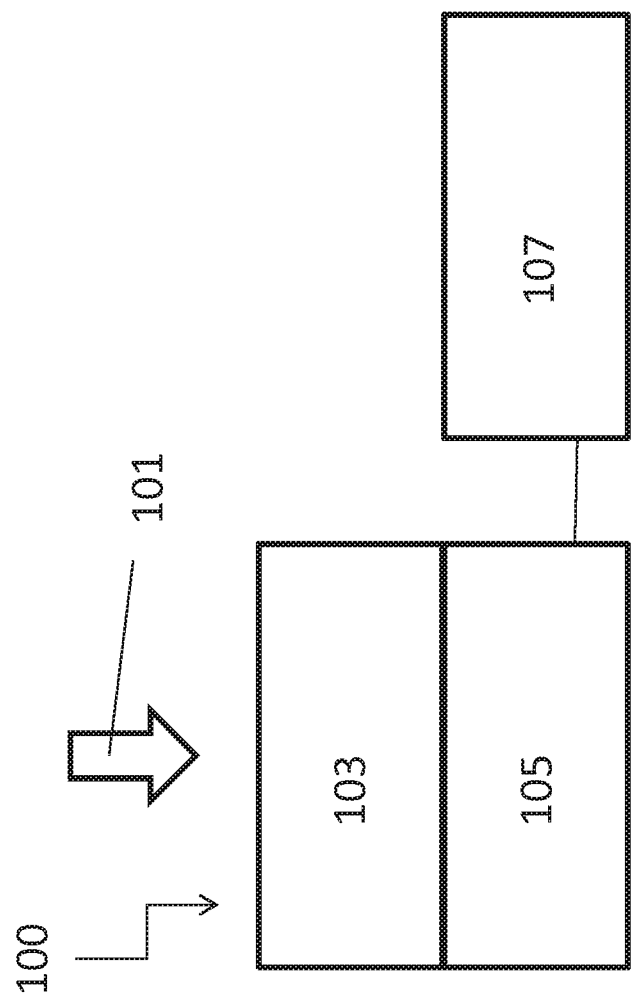
FIG. 1 shows a photoreceptor.

An embodiment of the present invention provides a sensor unit for detecting beams. The sensor unit may include a number, e.g. a plurality, of organic photoreceptors and at least one computing unit. Respective photoreceptors of the organic photoreceptors are configured so as to generate a voltage or an electric pulse depending on the type and intensity of an incident radiation on the respective photoreceptors. The respective photoreceptors of the organic photoreceptors are directly connected to the at least one computing unit as a respective signal source.

Additional advantages and embodiments of the invention are evident from the description and the attached drawings.

In the context of the present invention, an organic photoreceptor means an element that comprises an organic phase that consists at least partially of organic semi-conductive materials and that generates a voltage when the element is irradiated, i.e. is exposed to a beam, for example, a light beam or an X-ray beam.

In particular, an organic photoreceptor means an element structured according to the principle of an organic light emitting diode.

An organic photoreceptor, according to the invention, generates a changing voltage depending on an incident radiation on the organic photoreceptor or a changing electrical pulse depending on an incident radiation on the organic photoreceptor.

In the context of the present invention, beams or radiation means electromagnetic radiation. For example, radiation can be thermal radiation, light (e.g., as ultraviolet light, infrared light or light visible to humans), as well as X-ray radiation.

In the context of the present invention, a direct connection between respective photoreceptors provided for according to the invention and a computing unit provided for according to the invention means a connection that does not run via an intermediate layer, such as e.g. a CCD sensor. Accordingly, the direct connection provided for according to the invention between organic photoreceptor and computing unit uses a voltage generated or output by a respective organic photoreceptor directly as a signal source for further processing by a computing unit. Of course, a voltage signal output by an organic photoreceptor can be prepared before processing by a computing unit, i.e. for example, can be filtered by means of a filter. Processing by a CCD sensor or a CCD element does not occur, however, in the present sensor unit.

In an exemplary embodiment of the present sensor unit, it is provided that the respective photoreceptors of the number of organic photoreceptors are configured to detect radiation in a wavelength range of 10 picometers to 100 cm.

In particular, the present sensor unit is suitable for detecting X-ray radiation and/or light visible to humans.

In one example, respective organic photoreceptors of the number of photoreceptors provided for according to the invention are arranged as an at least partial organic layer on a carrier layer, which can be composed of an organic and an inorganic material, for example. Accordingly, in this example, a continuous layer of organic photoreceptors is applied that shows a very fine, i.e. very high spatial resolution of few micrometers.

By using the organic photoreceptors provided for according to the invention, an effect known among CCD sensors and described as "blooming," can be avoided because organic photoreceptors are not subject to an "overload" or to an interaction between individual photoreceptors. Overloading of the CCD sensors is prevented by the direct wiring, provided for according to the invention, of the organic photoreceptors to a respective computing unit, because with such a direct wiring, all electrical changes from the photoreceptors can be immediately "drained." The direct wiring of the organic photoreceptors to the respective computing units avoids a hurdle being caused by a CCD sensor for electrical signals on their path to the respective computing units.

In an exemplary embodiment of the present sensor unit, it is provided that the respective photoreceptors of the number of organic photoreceptors are configured to detect at least one type of radiation from the following list of radiation types: X-ray radiation, radar radiation, light visible to humans, ultraviolet light and infrared light.

Accordingly, in another aspect, the present invention comprises a camera system with a number, e.g. a plurality, of organic photoreceptors and at least one computing unit that are aggregated together into, for example, a sensor unit according to the invention. Here, it is provided that respective photoreceptors of the number of organic photoreceptors are configured so as to generate a voltage or an electric pulse depending on the type and intensity of an incident radiation on the respective photoreceptors. Furthermore, it is provided that the respective photoreceptors of the number of organic photoreceptors are directly connected as a signal source to the at least one computing unit and the at least one computing unit is configured to generate an image from the information and/or electrical pulses ascertained from the number of organic photoreceptors.

In an exemplary embodiment of the present sensor unit, it is provided that the respective photoreceptors of the number of organic photoreceptors or at least one photoreceptor of the number of organic photoreceptors have or has a corresponding organic layer for each type of radiation to be detected.

Through the use of multiple different organic layers or different types of organic photoreceptors, the present sensor unit can be configured to detect different types of radiation, such as X-ray radiation and light visible to humans, for example.

In this regard, each individual photoreceptor can comprise multiple layers, such as organic layers, for example.

The different types of radiation can be detected in parallel or simultaneously.

Alternatively, the sensor unit, e.g. in the event that not all photoreceptors have multiple aforementioned layers, can be switched from a first mode in which solely those organic photoreceptors are used that are suitable for detecting a first beam type, such as X-ray beams, for example, to a second mode in which solely those organic photoreceptors are used that are suitable for detecting a second beam type, such as light visible to humans, for example. For this purpose it is possible to switch between different photoreceptors, for example. For example, in the first mode, solely signals of a first photoreceptor or a group of first photoreceptors that is, or are, configured to detect a first beam type, and in the second mode, solely signals of a second photoreceptor or a group of second photoreceptors that is, or are, configured to detect a second beam type, can be received or processed by a respective computing unit.

In another exemplary embodiment of the present sensor unit, it is provided that the respective photoreceptors of the number of organic photoreceptors are arranged on a surface that, during operation of the sensor unit, is curved, at least some of the time.

By using a curved surface, i.e. a surface that has a concave and/or convex curvature, sensor geometries can be exhibited that result in an especially advantageous beam path. In this manner, e.g. by using a convex surface on which respective organic photoreceptors are arranged, a panorama-like information flow can be generated. This means that beams can be received by the organic photoreceptors from an especially wide-angled region.

By using a concave surface on which the respective organic photoreceptors are arranged, an information flow can be generated that has multiple perspective points. This means that by using a concave surface, multiple lenses, such as those typical of stereo camera systems, for example, can be simulated. Accordingly, by using a concave surface, it is possible to locate an object in a representational space since information from multiple perspective points can be compared, in order to deduct a current position of an object, e.g. by triangulation.

In an example, it is provided that each individual organic photoreceptor be used as a separate perspectival sensor, such that with a combination of information or electrical pulses determined by the organic photoreceptors, an image is obtained that resembles or is identical to an image obtained by means of an ommatidium in which the individual electrical pulses of the respective photoreceptors are collated into an overall image, wherein e.g. all electrical pulses are processed independently from one another in the computing unit.

In another exemplary embodiment of the present sensor unit, it is provided that the sensor unit comprises at least one actuator that is configured to curve the surface at least in some region(s) and at least at some of the time.

By means of an actuator, such as a piezo element, for example, a surface, such as e.g. a plastic layer, carrying the organic photoreceptors provided for according to the invention, can be deformed and, for example, at least in some region(s) bent into a concave and/or convex shape.

In another aspect, the present invention provides a sensor actuator system with a number, e.g. a plurality, of organic photoreceptors and at least one computing unit. It is provided that respective photoreceptors of the number of organic photoreceptors are configured so as to generate a voltage or an electric pulse depending on the type and intensity of an incident radiation on the respective photoreceptors. It is furthermore provided that the respective photoreceptors of the number of organic photoreceptors are directly connected to the at least one computing unit as a signal source. Furthermore, the sensor actuator system comprises an actuator configured to move and/or deform, i.e. to bend, rotate, slide or extend, for example, a surface on which the number of organic photoreceptors is arranged.

In another exemplary embodiment of the present sensor unit, it is provided that the respective photoreceptors of the number of organic photoreceptors are arranged on a first side of a carrier film and an electronic circuit for connecting the respective photoreceptors of the number of organic photoreceptors to the at least one computing unit is arranged on a second side of the carrier film.

In one example, a carrier film, such as e.g. a plastic foil or a composite plate, can have organic photoreceptors on a first side that faces e.g. an environment, and on a second side that is opposite to the first side, have an electric circuit to transmit electrical pulses from respective photoreceptors to a respective computing unit. The carrier film can have an organic and/or an inorganic layer.

In this regard, the electrical circuit can be printed on the carrier film.

Alternatively or additionally, the respective organic photoreceptors can be vapor-deposited onto the carrier film.

In one example, the carrier film is permanently curved. In another example, the carrier film is curved, e.g. by using an actuator such as e.g. a piezo crystal, some of the time at least in some region(s).

In another exemplary embodiment of the present sensor unit, the carrier film is part of a display unit of a mobile computing unit.

When the present sensor unit is used as part of a display unit of a mobile computing unit, such as e.g. a smartphone, the respective organic photoreceptors can be supplied with electricity at a first point in time in order to represent image information and can, at a second point in time, be used as a sensor unit for detecting beams. Here it can be provided, for example, that one part of all the photoreceptors of the sensor unit are used to represent image information, and in parallel, another part of the photoreceptors is used to detect beams.

In another aspect, the present invention relates to a layer made of a number of organic photoreceptors, which, depending on operating mode, are configured both as organic LEDs (OLEDs) for representing information as well as for detecting beams.

In another exemplary embodiment of the present sensor unit, it is provided that the respective photoreceptors of the number of organic photoreceptors, are at least configured for detecting X-rays.

Through the use of organic photoreceptors as sensors for detecting X-ray radiation, it is possible to dispense with scintillators that are traditionally applied when CCD sensors are used. Accordingly, through the use of organic photoreceptors as sensors for detecting X-ray radiation, a loss of incident radiation energy due to respective scintillators is avoided.

When using organic photoreceptors as sensors for detecting X-ray radiation, the organic photoreceptors can be directly irradiated, i.e. without a filter or scintillator.

In another exemplary embodiment of the present sensor unit, it is provided that the sensor unit is structured as a camera system.

Using the present sensor unit, a camera system can be supplied that records moving images as a video camera, for example, or records still images as a photo camera.

In another exemplary embodiment of the present invention, it is provided that the camera system has a curved carrier structure on which the respective photoreceptors of the number of organic photoreceptors are arranged.

By using a curved carrier structure, a panorama image or multi-perspective image, for example, can be enabled.

The carrier structure can be, for example, hemispherical or fully spherical.

In another exemplary embodiment of the present sensor unit it is provided that a number of organic photoreceptors of the plurality of photoreceptors is configured as an ommatidium for generating a pixel.

In another exemplary embodiment of the present sensor unit, it is provided that at least one mirror is arranged behind the number of organic photoreceptors in the direction of incidence of respective beams incident on the sensor system and respective organic photoreceptors of the number of organic photoreceptors are configured to amplify the beams incident on the sensor system in relation to the at least one mirror.

For example, it can be provided that a carrier layer on which the respective organic photoreceptors are arranged is mirrored, i.e. provided with a mirroring surface.

Through one or multiple mirrors arranged behind respective organic photoreceptors in the direction of incidence of respective beams, the incident beams can be reflected, at least in part, and due to this, a "light yield," i.e. a quantity of beams to be received or detected by the organic photoreceptors, can be maximized.

Depending on the number and arrangement of respective mirrors or reflective surfaces, different focal distances, for example, of an optical system can be realized.

In one example, one mirror can be provided as a main receptor and one mirror can be provided as a correction receptor. By means of the correction receptor, an error in the main receptor can be corrected with an inverse error (null corrector). For that purpose, the correction receptor can be adapted individually, i.e. depending on optical characteristics of the main receptor.

In another aspect, the present invention relates to a light amplification system with a number of organic photoreceptors. It is provided that the light amplification system comprises at least one computing unit, wherein respective photoreceptors of the number of organic photoreceptors are configured to generate a voltage, depending on the type and intensity of an incident radiation. Here, it is provided that the respective photoreceptors of the number of organic photoreceptors are directly connected to the at least one computing unit as a signal source. It is furthermore provided in this regard that at least one mirror is arranged behind the organic photoreceptors in the direction of incidence of the beams incident on the organic photoreceptors, which mirror reflects the incident beams at least in part back to the respective organic photoreceptors.

A light amplification system equipped with at least one mirror or a sensor unit according to the invention combined with at least one mirror is suitable e.g. for use as or within a telescope. Multiple mirrors, for example, can be arranged such that this incident light is directed onto one or a selected number of organic photoreceptors. The respective mirrors can also be arranged around the organic photoreceptors, i.e. in a raised position in the direction of incidence of the incident beams relative to the organic photoreceptors.

In another aspect, the present invention relates to a sensor system with a sensor unit according to the invention and a beam source.

Through a combination of the present sensor unit with a beam source, a sensor system can be provided that is suitable for detecting characteristics of an object. During an irradiation of the object by the beam source, beams emitted by the beam source are diffracted or scattered. Accordingly, a radiation to be detected by the sensor unit changes depending on electromagnetic characteristics of the object.

In a exemplary embodiment of the present sensor system, it is provided that the beam source is at least configured to emit or radiate X-ray radiation.

Through a beam source emitting X-ray radiation, a material quality can be determined by, for example, checking an object for hairline cracks.

In another aspect, the present invention relates to a method for manufacturing the present sensor unit, in which the respective photoreceptors of the number of organic photoreceptors and/or an electronic circuit for connecting the respective photoreceptors of the number of organic photoreceptors to the at least one computing unit are printed on a carrier film.

In an exemplary embodiment of the present method, it is provided that the respective photoreceptors of the number of organic photoreceptors are vapor-deposited onto the carrier film.

In one example, the organic photoreceptors can be vapor-deposited onto a carrier film using a Physical Vapor Deposition (PVD) method.

In another aspect, the present invention relates to a test method for verifying a material structure of a component, in which beams are directed onto the component by means of a beam source. In the present test method, by means of an embodiment of the present sensor unit, beams reflected by the component and/or beams passing through the component are detected. A quality of the component is assessed based on the detected beams.

In another aspect, the present invention relates to an image acquisition method for detecting image information in which an environment is detected by means of an exemplary embodiment of the present sensor unit.

In an exemplary embodiment of the image acquisition method, it is provided that an object to be detected is irradiated with a beam source. Furthermore, it is provided that the beam source is moved around the object during a detection procedure, independently from the sensor unit or together with the sensor unit. In a first alternative, it may be provided that the object is rotated while the beam source and sensor unit remain stationary. In a second alternative, a relative motion of all elements, i.e. of the object, sensor unit and beam source, relative to one another may be provided.

In another exemplary embodiment of the present image acquisition system, it is provided that the respective photoreceptors of the number of organic photoreceptors of the sensor unit are arranged on a surface that is convex and/or concave in form, at least in some region(s). Furthermore, it is provided that based on an image obtained using the photoreceptors arranged in concave fashion, using known positions of multiple perspective points induced by the concave form, a position determination of an object represent in the image is performed.

By means of a sensor unit that is concave at least in some region(s), a recorded image of an environment from multiple perspectives can be enabled, such that an effect results that corresponds to an image recorded by means of multiple cameras or a stereo camera. With the knowledge of a precise position of respective perspective points induced by the concave form, it is possible to ascertain a position of an object detected by means of a sensor unit structured in that manner within a respective environment, i.e. a position of the object can be determined.

For example, the object can be triangulated by means of known positions of two perspective points.

It is understood that the aforementioned features and the features still to be explained hereafter are not only usable in the corresponding cited combinations, but also in other combinations or as a stand-alone feature without leaving the context of the present invention.

Based on exemplary embodiments, the invention is schematically illustrated in the drawings and is described in detail in the following with reference to the drawings.

In FIG. 1, a photoreceptor 100 is depicted. Here incident radiation, as depicted by arrow 101, is first directed through an organic layer 103 and then onto a CCD sensor 105. Electrical pulses emitted by the CCD sensor 105 are conveyed to a computing unit 107 for further processing. The organic layer serves, e.g., to amplify or filter incident radiation.

Figure 2:
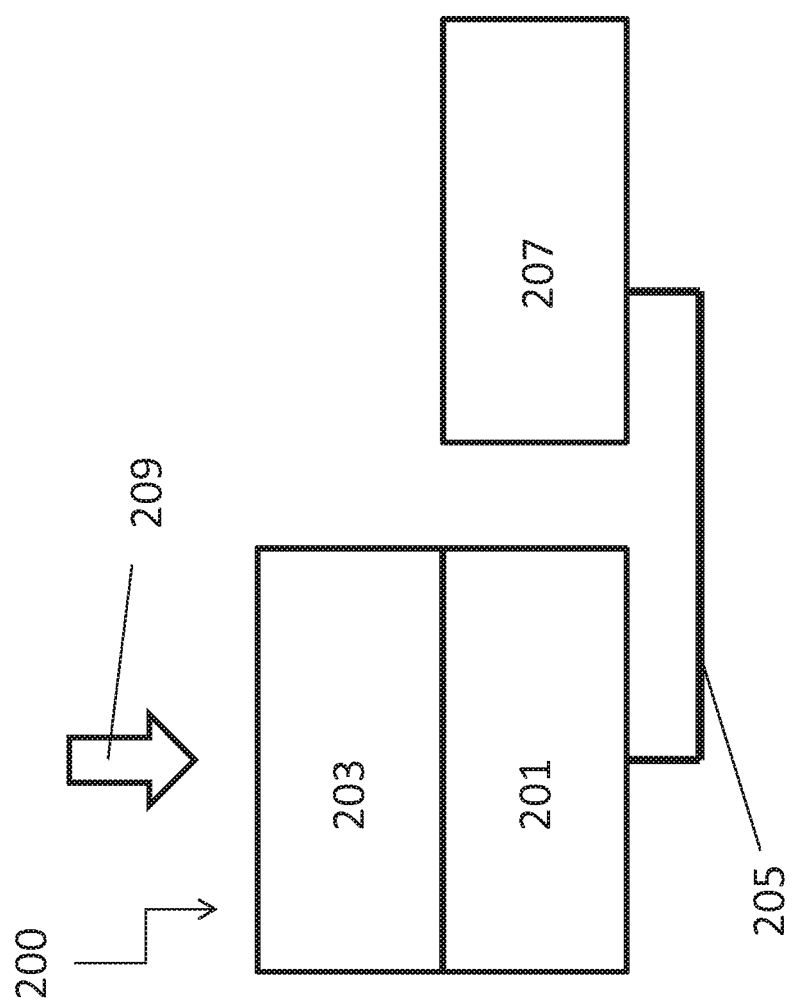
FIG. 2 shows an exemplary embodiment of the sensor unit according to the invention.

In FIG. 2, an exemplary embodiment of the sensor unit 200 is depicted. The sensor unit 200 comprises a carrier layer 201 on which organic photoreceptors 203 are arranged. The organic photoreceptors are connected directly to a computing unit 207 via electrical lines 205. In one example, incident radiation, i.e., for example, X-ray radiation, radar radiation, light visible to humans, ultraviolet light or infrared light, or radiation with a wavelength of 10 picometers to 100 cm, as indicated by arrow 209, results in a voltage change in the organic photoreceptors 203. This voltage change is transmitted via the electric lines 205 directly to the computing unit 207 and can be processed there as a sensor signal. Accordingly, no CCD sensor is required, in contrast to the photoreceptor 100, as shown in FIG. 1.

Figure 3:
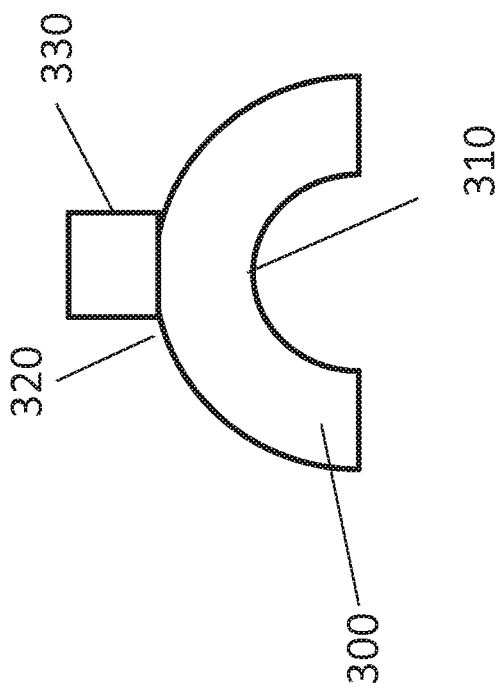
FIG. 3 shows an embodiment of the sensor unit according to the invention with a convex curvature.

In FIG. 3, a convex-curved sensor unit 300 with a carrier layer 310 and a photoreceptor layer 320 is depicted. The photo receptor layer 320 is directly connected to a computing unit 330. Here the sensor unit 300 is hemispherical. Through the convex form of the sensor unit 300, an especially wide-angled exposure field is enabled, such that the sensor unit 300 can provide especially wide-angled recorded images or panorama recorded images of an environment.

Figure 4:
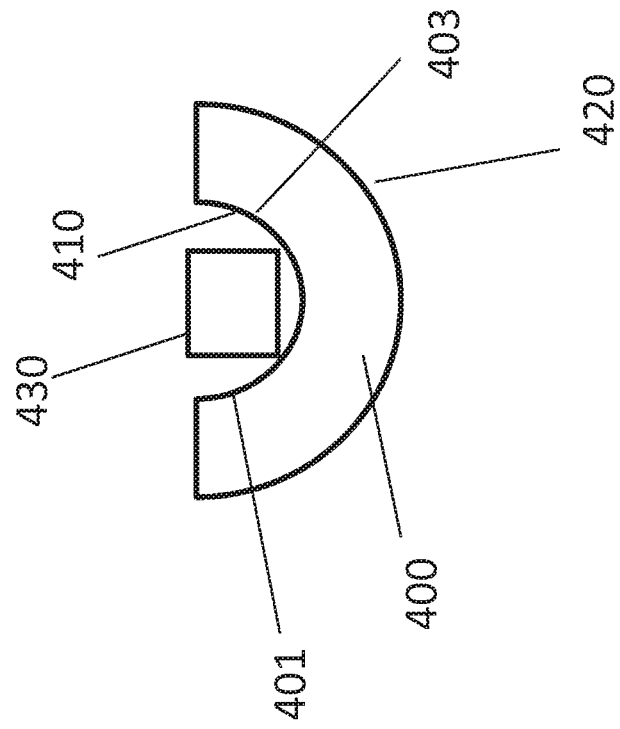
FIG. 4 shows an embodiment of the sensor unit according to the invention with a concave curvature.

In FIG. 4, a concave-curved sensor unit 400 with a carrier layer 410 and a photoreceptor layer 420 are depicted. The photoreceptor layer 420 is directly connected to a computing unit 430. Due to the concave form of the sensor unit 400, different perspective points 401 and 403 are realized that can be used, according to the principle of a stereo camera, for determining an object detected by means of the sensor unit 400, e.g. by using a triangulation method to determine a position of the object, i.e. for position determination.

Figure 5:
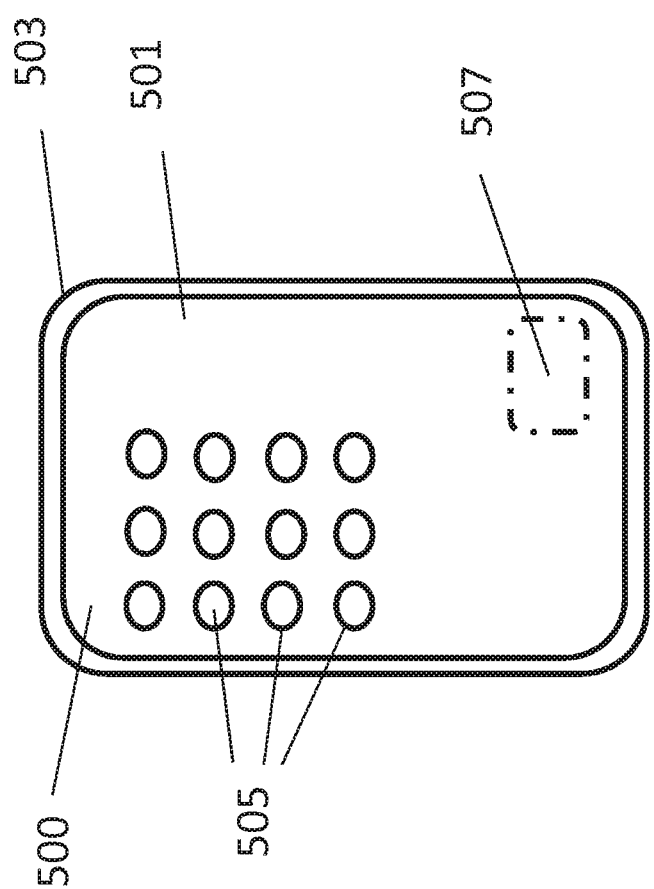
FIG. 5 shows an exemplary embodiment of the sensor unit according to the invention as a part of a display unit of a mobile computing unit.

In FIG. 5, a sensor unit 500 is shown that is structured as a part of a display unit 501, i.e. of a touchscreen of a mobile computing unit 503 in the form of a smartphone. Accordingly, an entire area of the display unit 501 can be used as a receptor or sensor for detecting radiation.

Of course, it is conceivable that merely a part of the organic photoreceptors 505 are arranged on the display unit 501 as sensors for detecting radiation/beams and another part of the organic photoreceptors 505 arranged on the display unit 501 for depicting image information by supplying the organic photoreceptors 505 arranged on the display unit 501 with electrical power.

It is conceivable that at a first point in time, the organic photoreceptors 505 arranged on the display unit 501 are used as sensors to detect radiation/beams, such that electrical pulses are transmitted from the organic receptors to a computing unit 507. Furthermore, it is conceivable that at a second point in time electrical pulses are transmitted from the computing unit 507 to the organic receptors in order to use the organic photoreceptors as pixels to represent image information.

Figure 6:
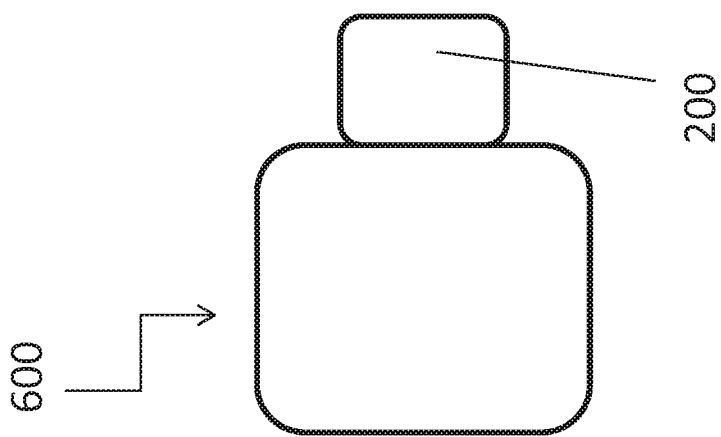
FIG. 6 shows an exemplary embodiment of the sensor unit according to the invention as part of a camera.

In FIG. 6, a camera 600 is depicted. The camera 600 is equipped with a sensor unit 200, as depicted in FIG. 2.

Figure 7:
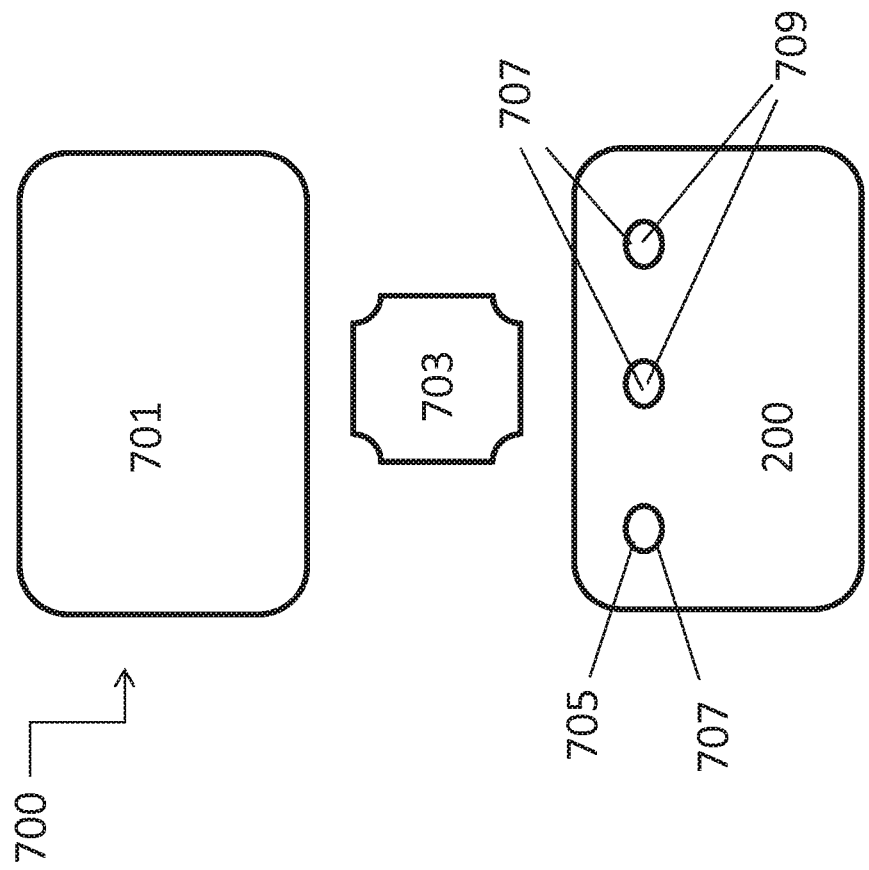
FIG. 7 shows an exemplary embodiment of the sensor system according to the invention.

In FIG. 7, a sensor system 700 is depicted. The sensor system 700 comprises an embodiment of the present sensor unit 200, as it is depicted in FIG. 2, for example, and a beam source 701.

Through the beam source 701, that emits X-ray radiation, for example, defined beams, i.e. beams with a defined path, are radiated onto an object 703 to be examined. The beams are scattered by the object 703 such that based on the scattering of the beams that is detected by the sensor unit 200, conclusions can be drawn regarding respective characteristics of the object 703.

Of course, the beam source 701 can also be integrated into the sensor unit. In particular, it can be provided that a portion 705 of organic photoreceptors 707 of the sensor unit 200 is used as a beam source and another portion 709 of the organic photoreceptors 707 is used as sensors to detect radiation/beams reflected by the object 703.

In FIG. 8, a manufacturing method 800 for manufacturing a sensor unit, such as is depicted in FIG. 2, for example, is shown.

In a start step 801, an organic phase is vapor-deposited onto a first side of a carrier film made of plastic, for example. Here a PVD method, for example, can be used.

In a wiring step 803, an electronic circuit is printed on a second side of the carrier film for connecting the organic phase to a computing unit.

In FIG. 9, a flow sequence of a test method 900 is depicted.

In a placement step 901, an object is placed between a beam source and a sensor unit, such as is depicted in FIG. 2, for example.

In an irradiation step 903, the object is irradiated by a beam pulse by means of the beam source. The beam pulse is scattered or diffracted by the object. Alternatively or in addition, the beam pulse can be attenuated.

In a detection step 905, radiation scattered by the object is detected by means of the sensor unit and converted into image information. In the event that the beam pulse is attenuated in the irradiation step 903, the attenuated beam pulse can be detected by means of the sensor unit 905, analogous to an X-ray apparatus.

In an evaluation step 907, an automatic algorithm assesses a status of the object based on a comparison with a reference database.

Figure 10:
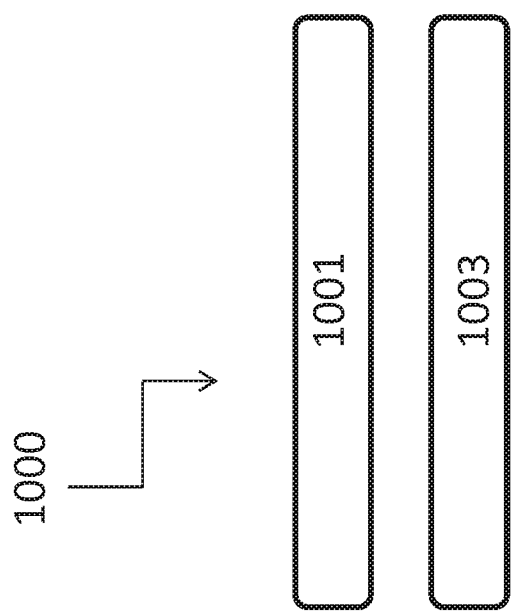
FIG. 10 shows an exemplary embodiment of the image acquisition method according to the invention.

In FIG. 10, an image acquisition method 1000 is depicted.

In a detection step 1001, organic photoreceptors of a sensor unit, such as is depicted in FIG. 2, for example, are illuminated for a defined time period.

In an evaluation step 1003, sensor values obtained through the organic photoreceptors are converted into pixels by means of a computing unit of the sensor unit and a corresponding image is created.

Figure 11:
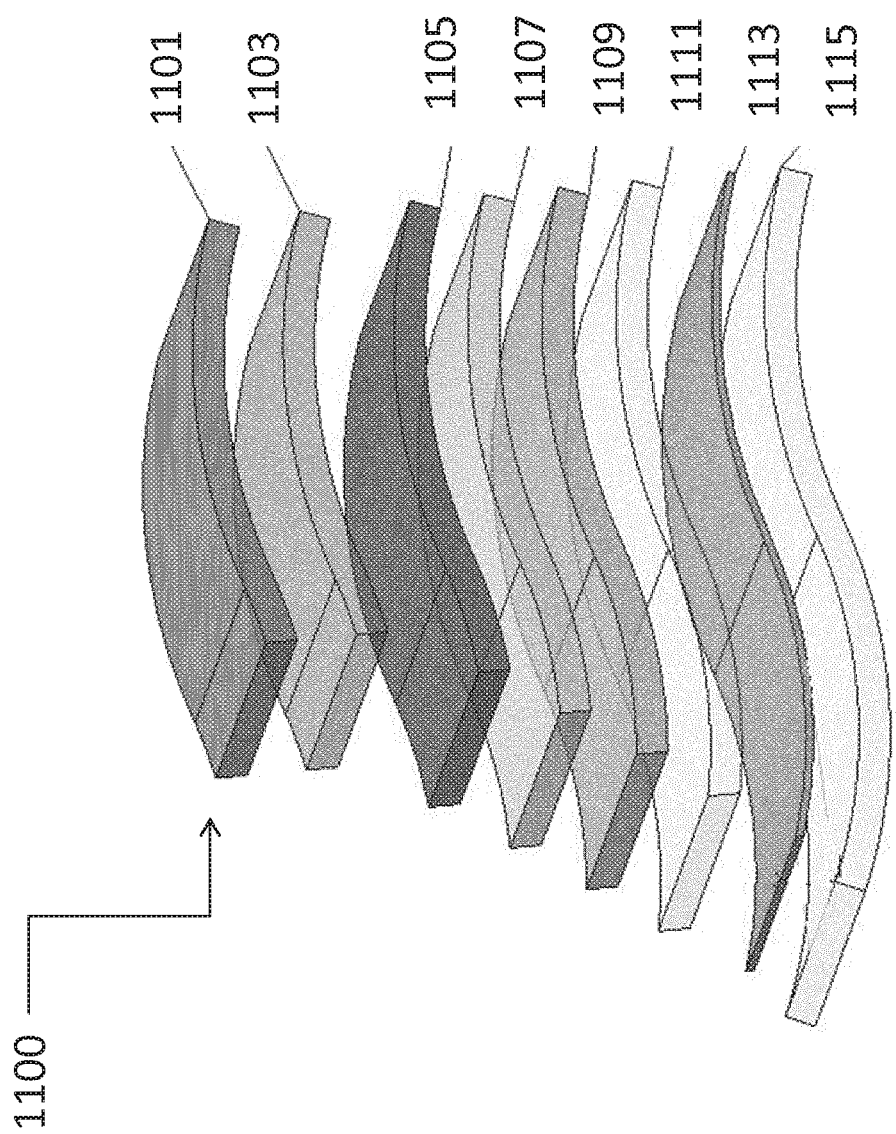
FIG. 11 shows an exemplary embodiment of an organic photoreceptor according to an exemplary embodiment of the sensor unit according to the invention.

In FIG. 11, a sensor unit 1100 is depicted. The sensor unit 1100 is composed of a plurality of layers 1101 to 1115, which comprise wavelength modulators, in particular, and which form an organic photoreceptor, for example.

In the context of the present invention, wavelength modulators are all those materials that absorb energy and emit it in the form of photons, which can then be absorbed by a light-active layer (e.g. an OLED), which for its part releases electrons. This means that wavelength modulators, which may be provided for as part of a sensor unit according to an exemplary embodiment of the sensor unit 1100, at least partially transform incident radiation into photons or wavelengths optimized for a respective organic photoreceptor layer and accordingly increase an electron release of the organic photoreceptor layer compared to an irradiation without wavelength modulators.

In design, the sensor unit 1100 can comprise at least one wavelength modulator or a combination of wavelength modulators according to the following principles: photoluminescence (adsorption of visible light), thermoluminescence (adsorption of heat), sonoluminescence (adsorption of sound), electroluminescence (adsorption of electrons), triboluminescence (adsorption of mechanical deformation), chemiluminescence (adsorption of energy by chemical reaction, also biological like fluorescing proteins GFP), scintillators (adsorption of high-energy radiation, gamma or particle radiation), fluorescence (adsorption of photons and emission with changed or at least the same wavelength Stokes' Shift) and/or phosphorescence (adsorption similar to fluorescence, however with time-delayed emission).

For example, wavelength modulators for the infrared range can be composed at least in part of gallium arsenide and/or indium gallium arsenide.

For example, wavelength modulators for the ultraviolet range can be composed at least in part of the following materials or substances or a combination thereof:

Fluorescein (2-(6-hydroxy-3-oxo-(3H)-xanthene-9-yl) benzoic acid, $C_{20}H_{12}O_5$) uranine ($C_{20}H_{10}Na_2O_5$), acridine orange zinc chloride ($C_{17}H_{20}Cl_3N_3Zn$), chromotropic acid disodium salt-dihydrate ($C_{10}H_6Na_2O_8S_2*2\ H_2O$), calcein ($C_{30}H_{26}O_{18}$) and/or 1,2-phenylendiamine ($C_6H_8N_2$).

For example, wavelength modulators for the X-ray range can be composed at least in part from the following materials and/or substances or a combination thereof:

Inorganic crystals:

NaI, NaI-Tl, LiI-EU, CsI, CsI-Tl, BaF2, CeF3, BGO ($Bi_4Ge_3O_{12}$), GSO ($Gd_2SiO_5$:Ce), PbWO4, CaF, $CaF_2(Eu)_2$, CaWO4, CdWO4, YAG(Ce) ($Y_3AL_5O12(Ce)$) and/or lutetium aluminum garnet ($AL_5Lu_3O_{12}$)

Organic crystals:

naphthalene, anthracene and/or trans-stilbene

In fluid solution or plastic:

p-Terphenyl, t-PBD, PPO(2,5-Diphenyloxazole), ($C_{15}H_{11}NO$), POPOP (1,4-Bis[2-(5-phenyloxazolyl)]benzene) and/or $C_{24}H_{16}N_2O_2$ In FIG. 11, the sensor unit 1100 comprises a diffusion-proof enclosure 1101 that can be composed of, for example, parylene, SiOx, an electrode 1103, an active wavelength modulator or scintillator 1105, which can be composed of, for example, Si(TI), NAI (TI) for X-ray beams or can be designed to be fluorescence, in order to modulate beams in the ultraviolet range. Furthermore, the active wavelength modulator or scintillator 1105 can be designed as a receiver unit for radar beams or as GaAs for modulation of infrared beams.

Furthermore, the sensor unit 1100 comprises a transparent electrode 1107 made of ITO, for example, a light-active layer 1109 that can be designed to be absorbing and/or emitting, an additional transparent electrode 1111 made of ITO, for example, a layer made of active thin-film transistors (JFTS) 1113 and a substrate 1115, such as a transparent foil, for example.

In FIG. 11, the respective layers 1101 to 1115 are depicted as wave-shaped. However, it is also conceivable that the layers can form another geometric shape, such as a plane or a complex three-dimensional structure and overlap at least in part or interlock at least in part.

Figure 12:
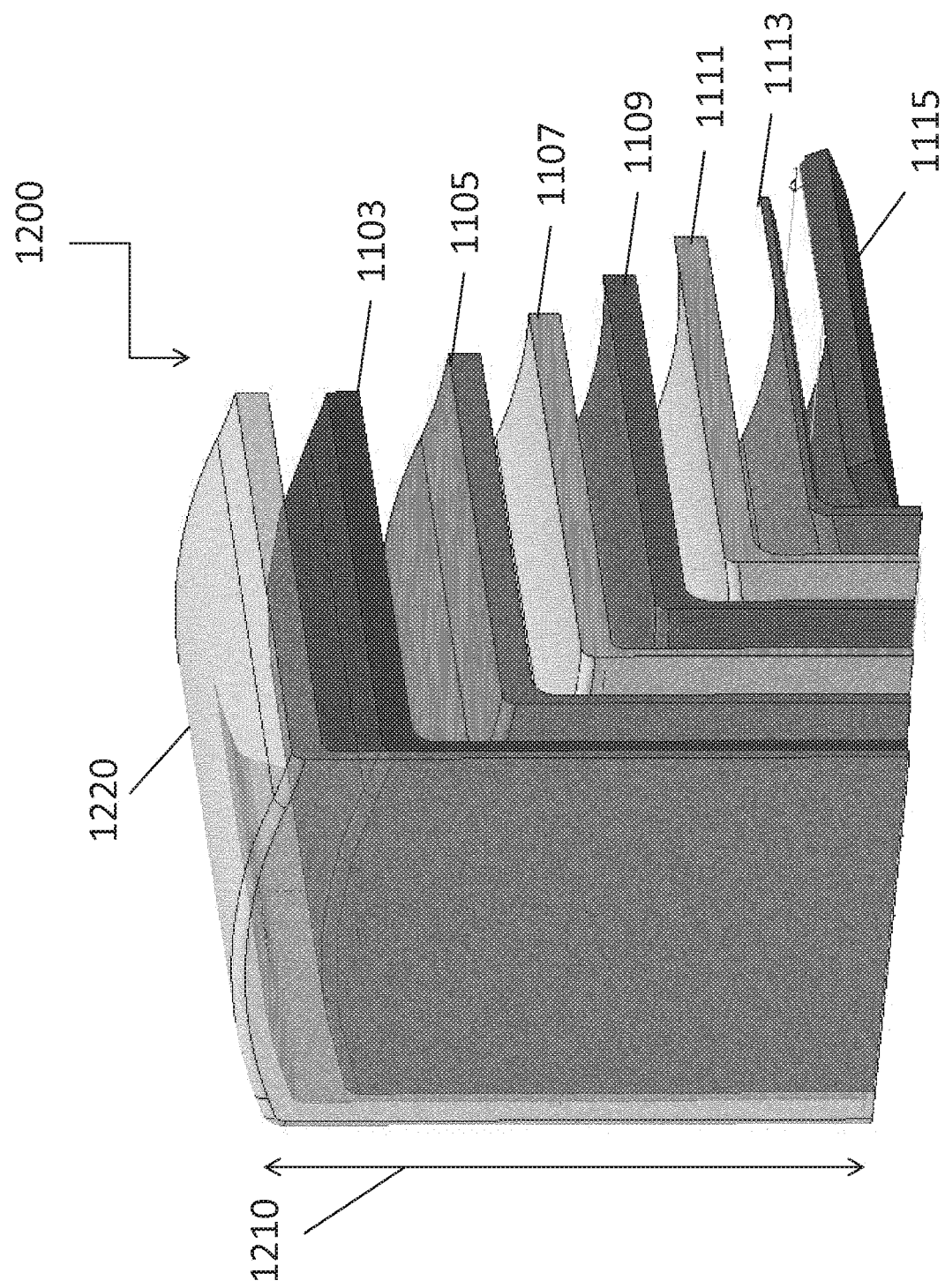
FIG. 12 shows an exemplary embodiment of an organic photoreceptor according to an exemplary embodiment of the sensor unit according to the invention that is essentially enclosed laterally by a diffusion-proof enclosure.

In FIG. 12, a sensor unit 1200 with respective layers 1103 to 1115 are shown. The sensor unit comprises a diffusion-proof enclosure 1220 that surrounds the layers 1103 to 1115 essentially laterally, i.e. along at least one edge 1210 extending essentially vertical to the layers 1103 to 1115. The diffusion-proof enclosure 1220 can be composed of, for example, parylene, $SiO_x$ or any other technically suitable material.

In FIG. 13, a sensor unit 1300 with respective layers 1103 to 1115 is depicted. The sensor unit 1300 comprises a diffusion-proof enclosure 1310 that surrounds the layers 1103 to 1115 all-around or completely. The diffusion-proof enclosure 1310 can be composed of, for example, parylene, $SiO_x$ or any other technically suitable material.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A sensor unit for detecting beams, the sensor unit comprising:
   a plurality of organic photoreceptors; and
   at least one computing unit;
   wherein respective photoreceptors of the organic photoreceptors are configured to generate voltage depending on type and intensity of incident radiation;
   wherein the respective photoreceptors of the organic photoreceptors are directly connected to the at least one computing unit as a respective signal source via a direct connection that does not run through a charge-coupled device (CCD) sensor for immediate drainage of electrical changes from the respective photoreceptors to the at least one computing unit; and
   wherein the at least one computing unit is configured to generate an image based on the electrical changes from the respective photoreceptors.

2. The sensor unit according to claim 1, wherein the respective photoreceptors of the organic photoreceptors are configured to detect radiation within a wavelength range of 10 picometers to 100 cm.

3. The sensor unit according to claim 1, wherein the respective photoreceptors of the organic photoreceptors are configured to detect at least one radiation type out of the following radiation types: X-ray radiation, radar radiation, light visible to humans, ultraviolet light, or infrared light.

4. The sensor unit according to claim 3, wherein at least one photoreceptor of the organic photoreceptors has a corresponding organic layer for each radiation type to be detected.

5. The sensor unit according to claim 1, wherein the respective photoreceptors of the organic photoreceptors are arranged on a surface that is curved during an operation state of the sensor unit at least some of the time.

6. The sensor unit according to claim 5, wherein the surface is concave or convex at least in a region.

7. The sensor unit according to claim 5, wherein the sensor unit comprises at least one actuator that is configured to curve the surface at least in a region or at least some of the time.

8. The sensor unit according to claim 1, wherein the respective photoreceptors of the organic photoreceptors are arranged on a first side of a carrier film, and wherein an electronic circuit configured to connect the respective photoreceptors of the organic photoreceptors to the at least one computing unit is arranged on a second side of the carrier film.

9. The sensor unit according to claim 8, wherein the carrier film is part of a display unit of a mobile computing unit.

10. The sensor unit according to claim 1, wherein the sensor unit is a camera system.

11. The sensor unit according to claim 10, wherein the camera system has a curved carrier structure upon which the respective photoreceptors of the organic photoreceptors are arranged.

12. The sensor unit according to claim 11, wherein the carrier structure is a hemisphere.

13. The sensor unit according to claim 1, wherein a number of the organic photoreceptors are configured as an ommatidium for generating a pixel.

14. The sensor unit according to claim 1, wherein a layer that at least partially reflects the beams of the incident radiation is arranged behind the photoreceptors, in a direction of incidence of the beams incident on the organic photoreceptors.

15. A method for manufacturing the sensor unit according to claim 1, the method comprising:
   printing, on a carrier film, the respective photoreceptors of the organic photoreceptors or an electronic circuit configured to connect the respective photoreceptors of the organic photoreceptors to the at least one computing unit.

16. The method according to claim 15, further comprising:
   vapor-depositing, on the carrier film, the respective photoreceptors of the organic photoreceptors.

17. An image acquisition method for acquiring image information, the method comprising:
   detecting an environment of the sensor unit according to claim 1.

18. The image acquisition method according to claim 17, further comprising:
   automatically irradiating an object to be detected using a beam source.

19. The image acquisition method according to claim 18, further comprising:

moving at least one of the beam source, the object, or the sensor unit relative to others of the beam source, the object, or the sensor unit during a detection procedure.

20. The image acquisition method according to claim 17, wherein respective photoreceptors of a number of the organic photoreceptors of the sensor unit are arranged on a surface that is concave in form, at least in a region, and wherein the method further comprises performing, on an image obtained through the organic photoreceptors arranged in the concave fashion, a position determination of an object depicted in the image using known positions of multiple perspective points due to the concave form.

21. A sensor system, comprising:
at least one beam source;
a plurality of organic photoreceptors; and
at least one computing unit;

wherein respective photoreceptors of the organic photoreceptors are configured to generate voltage depending on type and intensity of incident radiation from the at least one beam source;

wherein the respective photoreceptors of the organic photoreceptors are directly connected to the at least one computing unit as a respective signal source via a direct connection that does not run through a charge-coupled device (CCD) sensor for immediate drainage of electrical changes from the respective photoreceptors to the at least one computing unit; and wherein the at least one computing unit is configured to generate an image based on the electrical changes from the respective photoreceptors.

22. The sensor system according to claim 21, wherein the at least one beam source is configured to emit at least X-ray radiation.

* * * * *